United States Patent
Kinoshita et al.

(10) Patent No.: US 9,230,958 B2
(45) Date of Patent: Jan. 5, 2016

(54) WIDE BAND GAP SEMICONDUCTOR APPARATUS AND FABRICATION METHOD THEREOF

(71) Applicant: FUJI ELECTRIC CO., LTD., Kawasaki-shi, Kanagawa (JP)

(72) Inventors: Akimasa Kinoshita, Tsukuba (JP); Takashi Tsuji, Tsukuba (JP); Kenji Fukuda, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/394,045

(22) PCT Filed: Mar. 14, 2013

(86) PCT No.: PCT/JP2013/057316
§ 371 (c)(1),
(2) Date: Oct. 10, 2014

(87) PCT Pub. No.: WO2013/153909
PCT Pub. Date: Oct. 17, 2013

(65) Prior Publication Data
US 2015/0129894 A1   May 14, 2015

(30) Foreign Application Priority Data

Apr. 12, 2012   (JP) .................................. 2012-091460

(51) Int. Cl.
*H01L 27/07* (2006.01)
*H01L 21/04* (2006.01)
(Continued)

(52) U.S. Cl.
CPC ........ *H01L 27/0766* (2013.01); *H01L 21/0254* (2013.01); *H01L 21/02529* (2013.01);
(Continued)

(58) Field of Classification Search
CPC ............ H01L 27/0684; H01L 27/0688; H01L 27/0696; H01L 27/1095; H01L 27/66325; H01L 27/66333; H01L 27/6634; H01L 27/66348; H01L 27/7393; H01L 27/7397; H01L 27/7827; H01L 21/38; H01L 21/04; H01L 21/0445; H01L 21/0455; H01L 21/046
See application file for complete search history.

(56) References Cited

U.S. PATENT DOCUMENTS

2006/0237813 A1* 10/2006 Hshieh et al. ................. 257/475
2008/0277669 A1* 11/2008 Okuno et al. ................... 257/77
(Continued)

FOREIGN PATENT DOCUMENTS

JP   10-233515 A   9/1998
JP   10-321879 A   12/1998
(Continued)

OTHER PUBLICATIONS

International Search Report of PCT/JP2013/057316 (PCT/ISA/210), mailing date of Jun. 18, 2013, w/English translation and form PCT/ISA1220 (6 pages).
(Continued)

*Primary Examiner* — Eduardo A Rodela
(74) *Attorney, Agent, or Firm* — Westerman, Hattori, Daniels & Adrian, LLP (57) ABSTRACT

A silicon carbide epitaxial layer formed by a low concentration wide band gap semiconductor of a first conductivity type is formed on the surface of a silicon carbide substrate formed by a high concentration wide band gap semiconductor of the first conductivity type. A Schottky electrode is formed on the silicon carbide epitaxial layer. The interface between the Schottky electrode and the silicon carbide epitaxial layer is used as a Schottky interface. Plural impurity regions of a second conductivity type are disposed at predetermined intervals in a lateral direction, in the silicon carbide epitaxial layer, at a position in the lower portion of the Schottky electrode in the depth direction. Because of the shape of the impurity regions, any leak current can be suppressed without raising the ON-resistance.

12 Claims, 5 Drawing Sheets

(51) Int. Cl.
| | |
|---|---|
| H01L 29/66 | (2006.01) |
| H01L 29/872 | (2006.01) |
| H01L 29/06 | (2006.01) |
| H01L 29/16 | (2006.01) |
| H01L 21/02 | (2006.01) |
| H01L 29/20 | (2006.01) |
| H01L 29/47 | (2006.01) |
| H01L 29/739 | (2006.01) |
| H01L 29/78 | (2006.01) |

(52) U.S. Cl.
CPC ........ *H01L21/0495* (2013.01); *H01L 29/0619* (2013.01); *H01L 29/1608* (2013.01); *H01L 29/2003* (2013.01); *H01L 29/47* (2013.01); *H01L 29/475* (2013.01); *H01L 29/6606* (2013.01); *H01L 29/7393* (2013.01); *H01L 29/7801* (2013.01); *H01L 29/872* (2013.01)

(56) References Cited

U.S. PATENT DOCUMENTS

| | | | | |
|---|---|---|---|---|
| 2009/0020855 | A1* | 1/2009 | Pyeon | 257/621 |
| 2009/0168471 | A1* | 7/2009 | Tsugawa et al. | 363/56.01 |
| 2010/0025693 | A1* | 2/2010 | Malhan et al. | 257/76 |
| 2011/0151654 | A1* | 6/2011 | Konishi et al. | 438/530 |
| 2014/0038329 | A1* | 2/2014 | Petti | 438/33 |
| 2014/0048901 | A1* | 2/2014 | Imagawa | 257/471 |
| 2015/0115285 | A1* | 4/2015 | Kinoshita et al. | 257/77 |

FOREIGN PATENT DOCUMENTS

| | | |
|---|---|---|
| JP | 2002-314099 A | 10/2002 |
| JP | 2002-359378 A | 12/2002 |
| JP | 2003-51601 A | 2/2003 |

OTHER PUBLICATIONS

Shenai et al., "Optimum Semiconductors for High-Power Electronics", IEEE Transactions on Electron Devices (vol. 36, pp. 1811-1823).

Yamamoto et al., "1200-V JBS Diodes with Low Threshold Voltage and Low Leakage Current", Materials Science Forum vols. 600-603, (2009), pp. 939-942.

Baliga Jayant B., "6.1.2 JBS Rectifier Structure: Reverse Leakage Model", Silicon Carbide Power Divices: B. Jayant Baliga, p. 108.

Sze S.M., "4.3 Depletion Region", Semiconductor Devices, Second Edition, pp. 93-99.

Notification of Transmittal of Translation of the International Preliminary Report on Patentability (Chapter I or Chapter II) (Form PCT/IB/338) of International Application No. PCT/JP2013/057316 mailed Oct. 23, 2014 with Forms PCT/IB/373 and PCT/ISA/237. (8 pages).

* cited by examiner

WIDE BAND GAP SEMICONDUCTOR APPARATUS AND FABRICATION METHOD THEREOF

TECHNICAL FIELD

The present invention relates to a wide band gap semiconductor apparatus and a fabrication method thereof. The semiconductor apparatus, in an apparatus having a wide band gap semiconductor interface with metal formed on a wide band gap semiconductor, has a portion of an interface between the wide band gap semiconductor and a deposited metal film, as a Schottky interface.

BACKGROUND ART

Single crystal silicon is conventionally used as a material of a power semiconductor device that withstands high voltage and controls high current. Various types of power semiconductor device are present and each is used for a use suitable therefor. For example, a bipolar transistor and an IGBT (insulated gate bipolar transistor) respectively can handle a high current density but these transistors are not capable of high speed switching. Frequency limits of for the bipolar transistor and the IGBT are on the order of several kHz and about several 10 kHz, respectively.

On the other hand, a power MOSFET (metal oxide semiconductor field effect transistor) cannot handle high current but this MOSFET can be used at high speeds and at a frequency up to about several MHz. In the market, demand is strong for a power device that can simultaneously cope with high current and high speed. Therefore, efforts have been made to improve the IGBT and the power MOSFET. Therefore, at present, development has advanced to the extent that the performance limitations are substantially the limit of the materials. Investigations concerning materials from the viewpoint of a power semiconductor device have been conducted, and silicon carbide (hereinafter, referred to as "SiC") has attracted attention as the next generation power semiconductor device because SiC is excellent in terms of low ON-voltage, high speed properties, and high temperature properties (see, e.g., Non-Patent Literature 1 below).

SiC is a highly stable material chemically, has a wide band gap of three eV, and can be used very stably as a semiconductor even at high temperatures. The highest electric field intensity thereof is also higher than that of Si by 10-fold or more. The same is true for gallium nitride (hereinafter, referred to as "GaN"), which is another wide band gap semiconductor material.

Similar to silicon, the wide band gap semiconductor enables fabrication of a Schottky barrier diode having a rectification property, by depositing a metal on the surface. Thus, a high voltage and low ON-resistance Schottky barrier diode can be realized using the wide band gap semiconductor as the material of the substrate.

Non-Patent Literature 1: "Optimum Semiconductors for High-Power Electronics", IEEE Transactions on Electron Devices (Vol. 36, p. 1811, 1989)

Non-Patent Literature 2: "1200-V JBS Diode with Low Threshold Voltage and Low Leakage Current", Materials Science Forum Vols. 600-603 (2009), pp. 939-942

Non-Patent Literature 3: "6.1.2 JBS Rectifier Structure: Reverse Leakage Model", Silicon Carbide Power Devices: B. Jayant Baliga, p. 108

Non-Patent Literature 4: "4.3 Depletion Region", Semiconductor Devices: S. M. Sze, pp. 93-99.

DISCLOSURE OF INVENTION

Problem to be Solved by the Invention

A diode having an ideal rectification property does not cause any electric current to flow therethrough when backward voltage is applied thereto, and has no resistance when forward voltage is applied thereto. Nonetheless, a commonly fabricated diode causes a slight amount of current (leak current) to flow therethrough when backward voltage is applied, and has some resistance (ON-resistance) when forward voltage is applied thereto. For an apparatus having a Schottky interface such as, for example, a Schottky barrier diode, the leak current thereof can be suppressed and the withstand voltage thereof can be increased when the Schottky barrier height (the barrier height) is high. However, in this case, the ON-resistance thereof becomes high.

On the contrary, when the Schottky barrier height is low, the ON-resistance is low while the leak current is high. In this manner, a trade-off relation is present between the leak current based on the backward electric property and the ON-resistance based on the forward electric property. Thus, a metal suitable for the use is selected for fabrication of the Schottky barrier diode. However, the Schottky barrier height of the fabricated Schottky barrier diode is characterized by the electron affinity of the semiconductor and the work function of the metal. Therefore, a Schottky barrier diode optimal for use cannot necessarily be fabricated.

As described, even with a wide band gap semiconductor Schottky barrier diode, the leak current is high when the Schottky barrier height is low. A diode is used that employs a junction barrier Schottky structure (hereinafter, referred to as "JBS structure") to address the above problem. The JBS structure suppresses the leak current by causing a first conductivity type semiconductor in a Schottky interface portion to be depleted by sandwiching a Schottky electrode of a first conductivity type semiconductor by a second conductivity type semiconductor. The leak current is suppressed to be lower as the thickness of the depletion layer (a width of the depletion layer spreading from the Schottky interface toward a semiconductor substrate) becomes wider.

A common JBS structure is a structure formed by alternately disposing in stripes, the first conductivity type semiconductor and the second conductivity type semiconductor that form the Schottky interface (see, e.g., Non-Patent Literature 2); and commonly has a constant width in the direction of depth. However, when the width is constant in the depth direction, concentration of the electric field occurs in a deep portion and this causes degradation of the withstand voltage.

With the JBS structure, the leak current becomes lower as the voltage for the depleting of the first conductivity type region becomes lower (see p. 108 of Non-Patent Literature 3). With the JBS structure having the second conductivity type regions disposed in stripes therein, as presented by a one-dimensional model, the manner in which the depletion layer spreads is determined by the impurity concentration of the first conductivity type semiconductor and that of the second conductivity type semiconductor (see p. 93 of Non-Patent Literature 4).

In view of the above problem, an object of the present invention is to enable suppression of the leak current in the JBS structure diode apparatus having the Schottky interface on the wide band gap semiconductor without raising the ON-resistance.

Means for Solving Problem

To solve the problems above and achieve an object, a wide band gap semiconductor apparatus according to the present invention has the following characteristics. The wide band gap semiconductor apparatus has a semiconductor substrate formed by a high concentration, wide band gap semiconductor of a first conductivity type; and a deposited semiconductor film formed on a surface of the semiconductor substrate and formed by a wide band gap semiconductor of the first conductivity type and having a concentration lower than that of the semiconductor substrate. A deposited metal film is formed on the deposited semiconductor film. A second conductivity type region is formed in a vicinity of the deposited metal film in the deposited semiconductor film. The second conductivity type region is disposed in plural, at predetermined intervals along a width direction in the deposited semiconductor film, at least at a position in a lower portion in a depth direction of the deposited metal film. The deposited semiconductor film has an internal width in the depth direction different from a width thereof at a position in an upper portion in the depth direction.

The second conductivity type regions are disposed in stripes from a planar view thereof.

An interval of the deposited semiconductor film is set to have a substantially rhombic shape with which the interval narrows from the position in the upper portion in the depth direction to the lower portion as a depth thereof becomes deeper and thereafter, widens.

The second conductivity type region has an impurity concentration distribution in the depth direction according to which an impurity concentration is set to be in a range of ±90% up to an arbitrary depth and the impurity concentration is lowered with a depth in a portion deeper than the arbitrary depth.

An interval of the deposited semiconductor film between a pair of second conductivity type regions has a width of 1 µm or greater, at a shortest portion thereof.

An interval of the deposited semiconductor film between a pair of second conductivity type regions has a width of 4 µm or less, at a shortest portion thereof.

The deposited semiconductor film is silicon carbide.

The deposited semiconductor film is gallium nitride.

A height of a Schottky barrier formed in an interface between the deposited metal film and the deposited semiconductor film is 1.0 eV or greater.

A height of a Schottky barrier formed in an interface between the deposited metal film and the deposited semiconductor film is 0.5 eV or greater and lower than 1.0 eV.

A wide band gap semiconductor apparatus fabrication method according to the present invention has the following characteristics. The wide band gap semiconductor apparatus has a semiconductor substrate formed by a high concentration, wide band gap semiconductor of a first conductivity type and a deposited semiconductor film formed on a surface of the semiconductor substrate and formed by a wide band gap semiconductor of the first conductivity type and having a concentration lower than that of the semiconductor substrate; a deposited metal film formed on the deposited semiconductor film. A second conductivity type region is formed in a vicinity of the deposited metal film in the deposited semiconductor film. Plural second conductivity type regions are disposed at predetermined intervals along a width direction in the deposited semiconductor film, and at least at a position in a lower portion in a depth direction of the deposited metal film. The deposited semiconductor film is formed to have an internal width in the depth direction different from a width thereof at a position in an upper portion in the depth direction.

The deposited semiconductor film is formed to have the internal width in the depth direction set to be wider than a width thereof at a position in an upper portion in the depth direction.

The deposited semiconductor film is formed to have the internal width in the depth direction set to be narrower than a width thereof at a position in an upper portion in the depth direction.

The deposited semiconductor film is formed in a substantially rhombic shape such that the deposited semiconductor film narrows as its depth increases from a position in an upper portion in the depth direction to a lower portion thereof and thereafter, widens.

According to the configuration above, with the JBS structure diode apparatus having the Schottky interface on the wide band gap semiconductor, any leak current can be suppressed while reducing the second conductivity type regions that cause reduction of the ON-resistance.

As to the interval of the deposited semiconductor film, the ON-voltage can be suppressed when the shortest portion thereof has a width 1 µm or greater. The interval of the deposited semiconductor film is set to have a substantially rhombic shape such that the interval narrows from a position in the upper portion in the depth direction to the lower portion according to a depth thereof and thereafter, widens and thereby, the effect achieved at the narrowest position appears as a favorable property. With the structure whose interval of the deposited semiconductor film narrows in the depth direction and then widens as the depth becomes deeper, the effect achieved at a position at which the concentration of the second conductivity type becomes low in a portion deeper from the depth at which the first conductivity type region becomes narrowest, appears as an excellent property. With the structure whose interval of the deposited wide band gap semiconductor film narrows in the depth direction and then widens as the depth becomes deeper, the ON-voltage can be suppressed to be low when the smallest width of the first conductivity type region is 1 µm or greater.

The above effects can be expected when silicon carbide (SiC) is used as the deposited semiconductor film. The same effects can also be expected when gallium nitride (GaN) is used as the deposited semiconductor film.

The Schottky barrier height needs to be high to fabricate the high voltage JBS structure diode. It can be expected that the fabricated diode operates as the high voltage JBS structure diode only when the Schottky barrier height is 1 eV or greater.

The Schottky barrier height has to have an appropriate value to fabricate the JBS structure diode to have a withstand voltage that is substantially voltage for use in a power source. It can be expected that the fabricated diode operates as, for example, a power source JBS structure diode only when the Schottky barrier height is 0.5 eV or greater and lower than 1 eV.

Effect of the Invention

According to the present invention, with the JBS structure diode apparatus having the Schottky interface on the wide band gap semiconductor, an effect is achieved in that any leak current can be suppressed without raising the ON-resistance.

BEST MODE(S) FOR CARRYING OUT THE INVENTION

Preferred embodiments of a wide band gap semiconductor apparatus and a fabrication method therefor according to the present invention will be described in detail with reference to the accompanying drawings. In the accompanying drawings and herein, the layers and the regions each having "n" or "p" attached at the head thereof mean that the majority carriers of the respective layers and the regions respectively are electrons or holes. "+" and "−" attached to "n" and "p" mean that the impurity concentrations are respectively higher and lower than those of the layers and regions without "+" and "−".

(First Embodiment)

Figure 1:
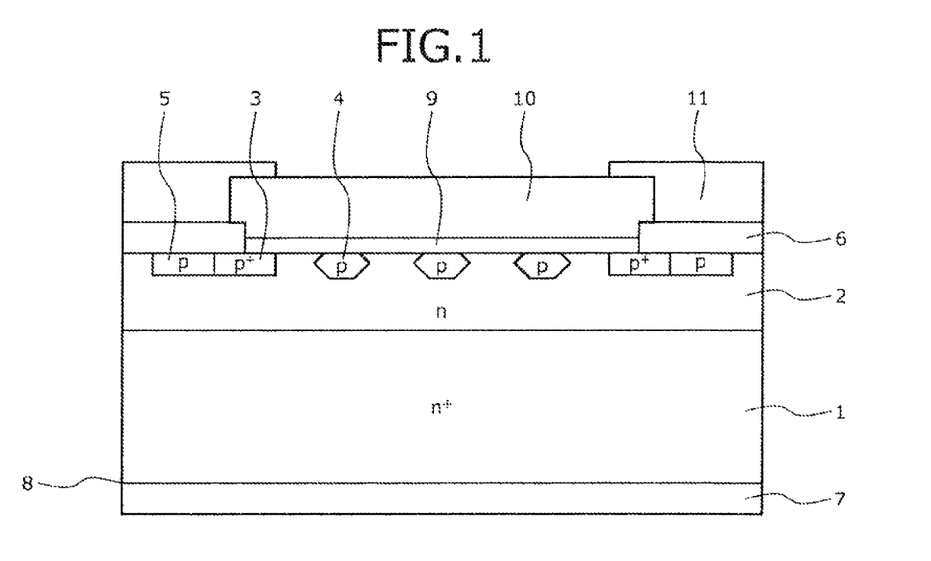
FIG. 1 is a cross-sectional structure diagram of a silicon carbide JBS diode according to a first embodiment of the present invention.

FIG. 1 is a cross-sectional structure diagram of a silicon carbide JBS diode according to a first embodiment of the present invention. In the silicon carbide JBS diode, a silicon carbide epitaxial layer (a deposited wide band gap semiconductor film) 2 of a first conductivity type (an n type) doped with nitrogen at a low concentration is formed, as a first region, on a principal surface (a surface) of a high concentration silicon carbide substrate 1 of the first conductivity type (the n type) doped with nitrogen at a high concentration, having a thickness of 300 μm, and having a (0001) plane as a principal surface. The silicon carbide substrate 1 and the silicon carbide epitaxial layer 2 are each formed by the wide band gap semiconductor.

Such regions are formed in the silicon carbide epitaxial layer 2 to form a junction termination extension (JTE) structure as: an impurity region 3 of a second conductivity type (a p type) doped with aluminum at a high concentration using ion implantation to avoid concentration of the electric field at an end of a Schottky metal; an impurity region 4 of the second conductivity type (the p type) doped with aluminum using ion implantation to form a junction barrier Schottky (JBS) structure; and an impurity region 5 of the p type doped with aluminum using ion implantation to further disperse the electric field at a termination portion.

The p-type impurity region 3 is disposed inside the p-type impurity region 5 and adjacent thereto, and is in contact with a deposited metal film (a Schottky electrode) 9. The p-type impurity region 4 is disposed inside the impurity region 3 along a direction of width, has a shape different from that of the impurity region 3, and is in contact with the deposited metal film 9. At a position in a lower portion of the deposited metal film 9 in the depth direction, plural impurity regions 4 are disposed at predetermined intervals along the width direction. The impurity regions 3 and 4 are in contact with the deposited metal film 9.

An oxide film 6 is formed as an interlayer insulating film, and is formed to cover a portion of the impurity region 3 and the upper portion of the impurity region 5 that is formed by the second conductivity type (the p type) semiconductor layer. A back face electrode 7 is formed on the back face of the silicon carbide substrate 1 and forms a junction with the high concentration n-type silicon carbide substrate 1 by an ohmic junction 8. A Schottky electrode 9 is formed as a second region in the Schottky interface on the n-type silicon carbide epitaxial layer 2. An electrode pad 10 formed by aluminum to be in contact with the Schottky electrode 9 and an insulating layer 11 of a material such as polyimide to prevent discharge are formed. The Schottky barrier diode is configured by the above components.

Figure 2:
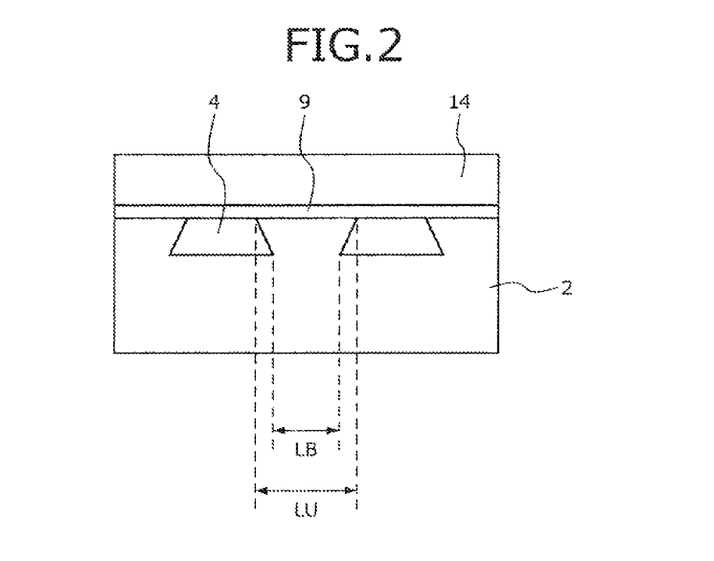
FIG. 2 is an enlarged cross-sectional diagram of an example of the JBS structure of FIG. 1.

FIG. 2 is an enlarged cross-sectional diagram of an example of the JBS structure of FIG. 1. The impurity regions 4 of the second conductivity type are cyclically disposed in the upper portion of the silicon carbide epitaxial layer 2 of the first conductivity type. Each of the impurity regions 4 of the second conductivity type depicted in FIG. 2 is formed to have a wide width in the lower portion thereof observed as to the depth direction (a bottom width) and to have a narrow width in the upper portion thereof (a top width); and therefore, has a substantially trapezoidal shape in its cross section. Thus, as to the silicon carbide epitaxial layer 2, in the depth direction of the first conductivity type, an internal width LB of the low concentration silicon carbide epitaxial layer 2 of the first conductivity type is narrower than a width LU on the surface.

Without limitation hereto, an inverted trapezoidal shape may be employed with which the internal width LB of the deposited semiconductor film 2 is formed to be wider than the width LU (not depicted). A substantially rhombic shape may also be employed with which a width is the widest at a position in the middle of the width LU on the surface and the internal width LB of the low concentration silicon carbide epitaxial layer 2 of the first conductivity type (not depicted). Observing the planar view of the semiconductor apparatus, the p-type impurity regions 4 are formed at the predetermined intervals, in stripes, in the n-type silicon carbide epitaxial layer 2.

In this embodiment, the configuration has been described of the Schottky barrier diode having the epitaxial layer disposed on the silicon carbide on the principal surface of the high concentration silicon carbide substrate 1 of the first conductivity type (the n type) having a (0001) plane as the principal surface. However, this configuration is also applicable to a (000-1)-plane substrate and, for example, is also applicable to a wide band gap semiconductor such as gallium nitride (GaN). Titanium (Ti) is also usable as a metal to form the Schottky interface (the Schottky electrode 9) of the Schottky barrier diode manufactured on the silicon carbide substrate 1. Without limitation to titanium, any material forming a Schottky interface is also applicable.

The JTE structure has been presented as a structure example for the impurity region 3 formed by the p-type and the impurity region 5 formed by the p type as an electric field mitigating structure. However, the same effect can also be achieved using the electric field mitigating structure such as a floating limiting ring (FLR) structure or a floating plate (FP) structure. The structure formed by forming the p-type electric field mitigating region on the n-type silicon carbide substrate 1 has been presented as the structure example. However, the same effect can be achieved with a structure using a different conductivity type such as a structure having an n-type electric field mitigating region formed on a p-type silicon carbide substrate.

(Fabrication Process Steps of JBS Structure Diode)

Figure 3:
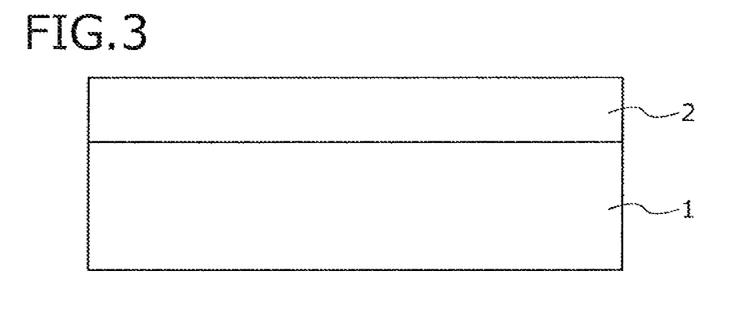
FIG. 3 is a cross-sectional structure diagram of manufacture process steps of the JBS structure diode according to the first embodiment of the present invention (part 1)

FIGS. 3, 4, 5, 6, 7, and 8 are cross-sectional structure diagrams of manufacture process steps of the JBS structure diode according to the first embodiment of the present invention. As depicted in FIG. 3, the low concentration n-type silicon carbide epitaxial layer (an n-type drift layer) 2 doped with nitrogen at $1.8 \times 10^{16}$ cm$^{-3}$ is deposited to have a thickness of 6 μm on the surface of the n-type silicon carbide substrate 1, which is an epitaxial layer doped with nitrogen at $1 \times 10^{18}$ cm$^{-3}$ and having a thickness of 300 μm.

Figure 4:
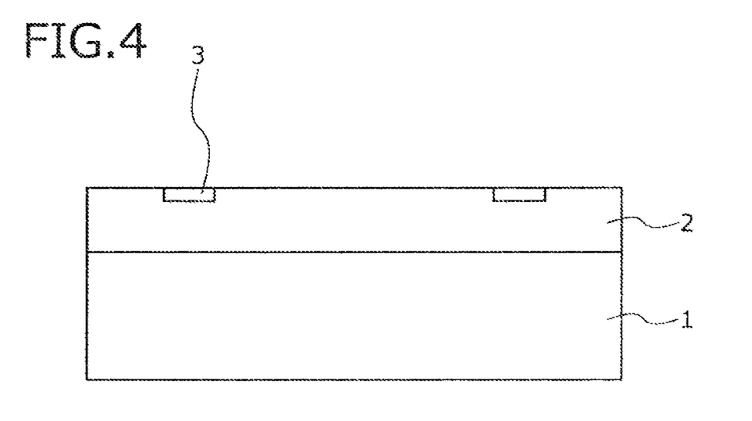
FIG. 4 is a cross-sectional structure diagram of manufacture process steps of the JBS structure diode according to the first embodiment of the present invention (part 2)

As depicted in FIG. 4, for example, aluminum is injected at a concentration of $3 \times 10^9$ cm$^{-3}$ into the silicon carbide epitaxial layer 2 using ion implantation into the silicon carbide substrate 1. The p-type impurity region 3 for a termination structure is formed in the surface layer of the silicon carbide epitaxial layer 2.

Figure 5:
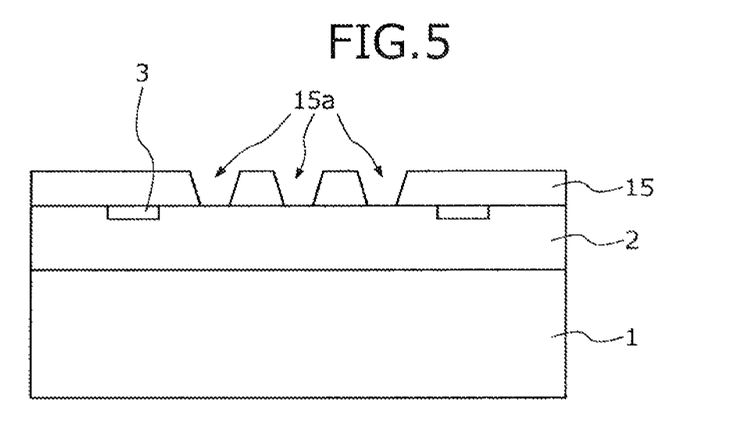
FIG. 5 is a cross-sectional structure diagram of manufacture process steps of the JBS structure diode according to the first embodiment of the present invention (part 3)

As depicted in FIG. 5, on the front face of the silicon carbide substrate 1, an ion implantation oxide film mask 15 is formed to form the JBS structure. The ion implantation oxide film mask 15 includes an opening 15a that corresponds to the position at which the impurity region 4 is formed. To utilize the spread in the lateral direction of the distribution of atoms injected by the ion implantation, the lateral spread for the depth direction can be realized by forming a tapered portion in the opening 15a of the ion implantation oxide film mask 15. For example, the opening 15a of the ion implantation oxide film mask 15 in contact with the n-type silicon carbide epitaxial layer 2 is caused to have a width of 2.5 μm and to have a shape whose upper portion is widely opened at a taper angle of 87 degrees. Using the ion implantation oxide film mask 15 as the mask, for example, aluminum is injected into the silicon carbide epitaxial layer 2 using the ion implantation.

For example, as to the acceleration energy and the dose amount of aluminum as the impurity to be injected, the injection is executed: first at 300 keV and at $5 \times 10^{14}$ ions/cm$^2$; thereafter, at 200 keV and at $3 \times 10^{14}$ ions/cm$^2$; at 100 keV and at $3 \times 10^{14}$ ions/cm$^2$; at 100 keV and at $2 \times 10^{14}$ ions/cm$^2$; and at 50 keV and at $3 \times 10^{14}$ ions/cm$^2$. Thereby, the impurity region 4 is formed having a box-like profile at the concentration of $3 \times 10^{19}$ cm$^{-3}$ at a depth of 0.5 μm. For the impurity region 4, the concentration distribution in the depth direction is set to be a concentration in a range of an arbitrary depth (that is, for example, up to 0.5 μm) ±90% and the concentration is set to be lower according to the depth in the portion deeper than the arbitrary depth.

The injection depth and the concentration can be adjusted based on the random dispersion and the channeling effect generated at the time of the ion implantation, by injecting the ions at an angle to execute the ion implantation, inclined from a direction perpendicular to the (0001) plane. For example, when aluminum is injected under the above condition at an angle inclined by 10 degrees from the direction perpendicular to the (0001) plane, the impurity region 4 has a box-like profile with the concentration of $3 \times 10^{15}$ cm$^{-3}$ up to the depth of 0.5 μm from the surface of the n-type silicon carbide epitaxial layer 2 and, for the portion deeper than 0.5 μm, aluminum of an amount to form the p type is distributed up to the depth of 1.0 μm decreasing exponentially.

Figure 6:
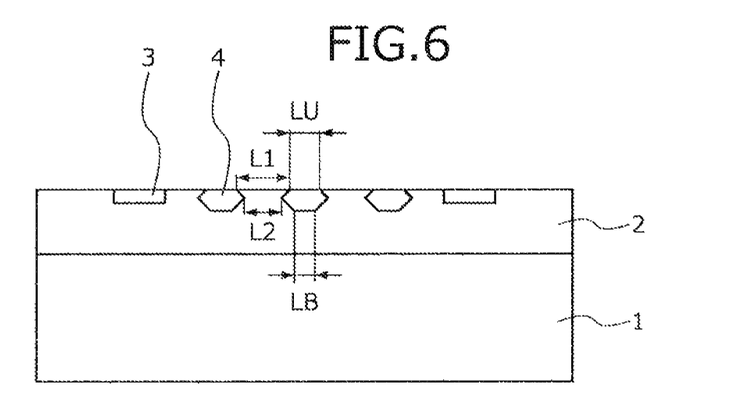
FIG. 6 is a cross-sectional structure diagram of manufacture process steps of the JBS structure diode according to the first embodiment of the present invention (part 4)

As a result, the impurity region 4 is formed that is formed by the p-type of the junction barrier Schottky (JBS) structure. As depicted in FIG. 6, a width L1 of the n-type region on the surface of the n-type silicon carbide epitaxial layer 2 is a width of 2.5 μm; the width of the n-type region becomes narrower as the depth becomes deeper in the depth direction to be a width L2 of 1.5 μm at a position at a depth of 0.5 μm; in a portion deeper than the position, the width of the n-type region becomes wide; and the p-type region is terminated at a position at a depth of 1.0 μm. In the example depicted in FIG. 6, the cross-sectional shape of the impurity region 4 is formed in a substantially rhombic shape. Preferably, the interval of the silicon carbide epitaxial layer 2 between a pair of impurity regions 4 is set to be a width 1 μm or greater and μm or less.

Figure 7:
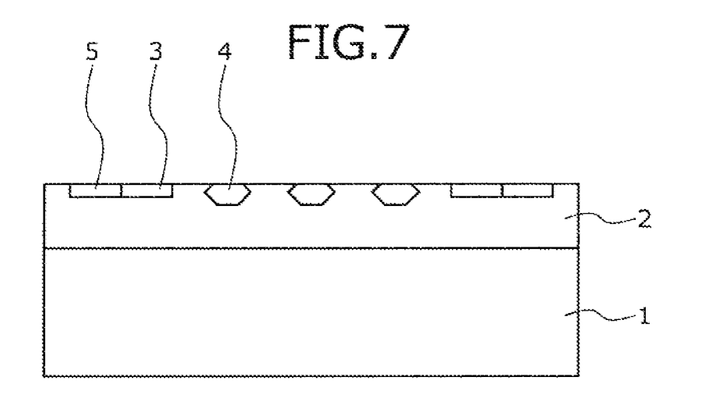
FIG. 7 is a cross-sectional structure diagram of manufacture process steps of the JBS structure diode according to the first embodiment of the present invention (part 5)

As depicted in FIG. 7, for example, aluminum is injected into the silicon carbide epitaxial layer 2 at a concentration of $3 \times 10^{17}$ cm$^{-3}$ using ion implantation to form the p-type impurity region 5 for a termination structure in the surface layer of the silicon carbide epitaxial layer 2. Thereafter, a heat activation process is executed, for example, for 240 seconds at 1,650 degrees C in an Ar atmosphere to activate the injected aluminum.

Figure 8:
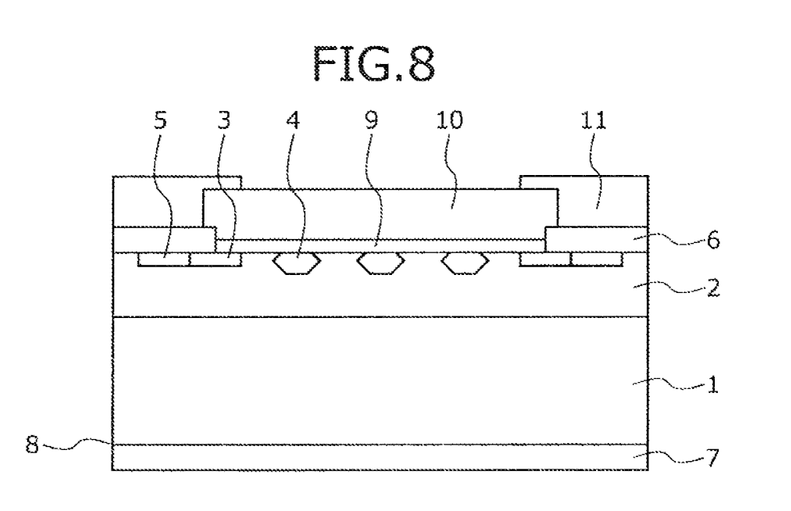
FIG. 8 is a cross-sectional structure diagram of manufacture process steps of the JBS structure diode according to the first embodiment of the present invention (part 6)

As depicted in FIG. 8, the oxide film 6 having a thickness of, for example, 0.5 μm is formed as the interlayer insulating film on a portion of the impurity region 3 and the upper portion of the impurity region 5 formed by the p type to cover these portions. For example, nickel (Ni) is deposited on the back face of the silicon carbide substrate 1 to have a thickness of 50 nm, and a heat treatment is executed for two min at 1,100 degrees C in an Ar atmosphere. Thereby, the back face electrode (the ohmic electrode) 7 is formed and a junction is formed with the high concentration n-type silicon carbide substrate 1 by an ohmic junction.

For example, titanium (Ti) is deposited on the n-type silicon carbide epitaxial layer 2 to have a thickness of 100 nm, and heat treatment is executed for five minutes at 500 degrees C in an Ar atmosphere. Thereby, the Schottky electrode 9 is formed. Finally, the electrode pad 10 formed by aluminum (Al) and having a thickness of, for example, 5 μm, and the insulating layer 11 made from polyimide and having a thickness of, for example, 8 μm to prevent discharge are formed. Thereby, the Schottky barrier diode is completed.

Figure 9:
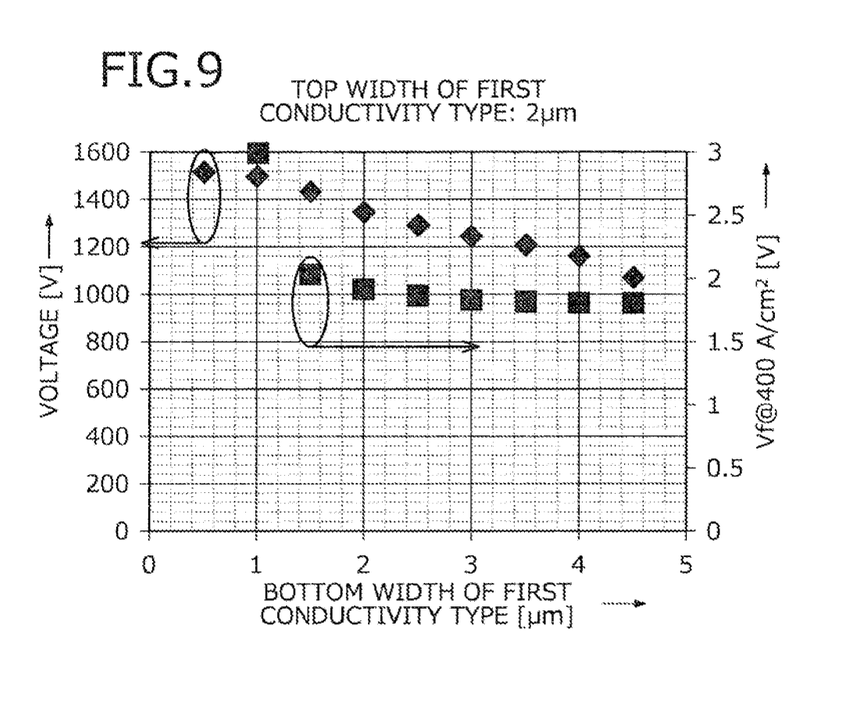
FIG. 9 is a chart of the relations between the width in a low concentration n-type substrate, and withstand voltage and ON-voltage (forward voltage) for the width of a n-region in a surface portion of the JBS structure portion under a Schottky electrode.

FIG. 9 is a chart of the relations between the width in the low concentration n-type substrate, and the withstand voltage and the ON-voltage (the forward voltage) for the width of the n-region in the surface portion of the JBS structure portion under the Schottky electrode. In the JBS structure, the leak current generally becomes lower as the voltage is lower to deplete the region of the silicon carbide epitaxial layer 2 of the first conductivity type. In the JBS structure having the impurity regions 4 of the second conductivity type disposed in stripes, as presented by the one-dimensional model, the manner in which the depletion layer spreads is determined by the impurity concentration of the silicon carbide epitaxial layer 2 of the first conductivity type and the impurity concentration of the second conductivity type.

The concentration of the electric field can be mitigated by adapting the structure to have the width in the depth direction of the silicon carbide epitaxial layer 2 of the first conductivity type, set not to be constant but to become narrower as the depth becomes deeper in the depth direction. Therefore, the voltage is reduced to deplete the region of the silicon carbide epitaxial layer 2 of the first conductivity type having the same area and therefore, an effect is achieved that any leak current can be suppressed. When the structure adapted to have the width in the depth direction of the silicon carbide epitaxial layer 2 set to be wide, the withstand voltage is degraded while an effect can be expected that the ON-resistance is reduced.

As presented by the simulation depicted in FIG. 9, the top width LU of the region of the silicon carbide epitaxial layer 2 of the first conductivity type formed under the deposited metal film 9 was set to be 2 μm, and the relation was calculated between the withstand voltage when the bottom width LB is varied and the voltage (the ON-voltage) obtained when current of 400 A/cm$^2$ is caused to flow in the forward direction. As a result, it was presented that, though the withstand voltage was improved, the ON-voltage was suppressed when the bottom width LB of the impurity region 4 of the second conductivity type formed under the deposited metal film 9 was narrower than the top width LU of the impurity region 4 of the second conductivity type formed under the deposited metal film 9.

To obtain a high voltage JBS structure diode, the height of the Schottky barrier (the Schottky barrier height) that is formed in the interface between the deposited metal film and the deposited semiconductor film has to be high, and when the Schottky barrier height in this embodiment is 1 eV or greater, it can be expected that the JBS structure diode of this embodiment operates as the high voltage JBS structure diode. When the Schottky barrier height is 0.5 eV or greater and lower than 1 eV, it can be expected that the JBS structure diode operates as a power source JBS structure diode having a withstand voltage that is substantially a voltage for use in a power source.

The ON-resistance can be reduced suppressing the leak current of the high voltage Schottky barrier diode for voltage of 1,000 V or greater and therefore, the chip area can be reduced and the unit price of the product can be reduced. Fabrication of a diode having large rated values is enabled, and application thereof to an inverter is enabled for an industrial electric motor or a bullet train car that requires a high current. Therefore, a contribution can be made to increase efficiency and downsize the apparatus.

(Second Embodiment)

Figure 10:
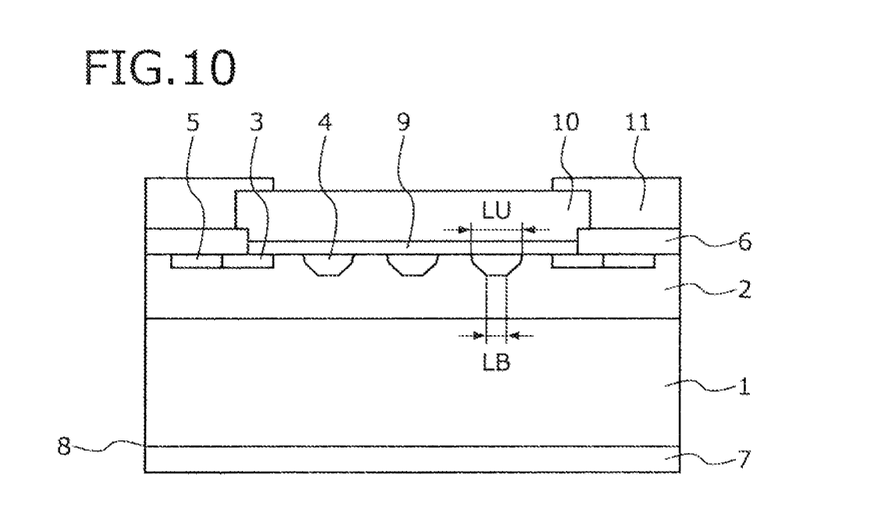
FIG. 10 is a cross-sectional structure diagram of a silicon carbide JBS diode according to a second embodiment of the present invention.

A second embodiment of the present invention will be described. FIG. 10 is a cross-sectional structure diagram of a silicon carbide JBS diode according to the second embodiment of the present invention. The second embodiment is another example of the shape of the impurity region 4 formed by a p-type semiconductor layer for the junction barrier Schottky (JBS) structure, and other structures are same as those of the first embodiment. Therefore, components identical to those of the first embodiment are given the same reference numerals used in the first embodiment.

In FIG. 10, the cross-sectional shape of the impurity region 4 is set to be an inverted trapezoidal shape and, as to the n-type silicon carbide epitaxial layer 2, the width of the n-type region on the surface is set to be, for example, 2.5 μm and the width of the n-type region becomes narrower as the depth becomes deeper in the depth direction. The p-type region is terminated at a position at a depth of 1.0 μm.

With this shape, the withstand voltage of the JBS structure portion is degraded while avalanche breakdown can be caused to occur in the JBS structure portion under the Schottky electrode 9 at a withstand voltage lower than that for the voltage withstanding structure portion of the impurity region 5. Therefore, an effect is achieved that the avalanche withstand amount can be increased. As described, according to the second embodiment, the same effect as that of the first embodiment can also be achieved.

In the described embodiments, the description has been made with reference to cross-sectional diagrams of the JBS structure diode having a termination structure. The present invention is also applicable to an apparatus using the Schottky junction such as a diode having the structure not departing from the spirit of the present invention such as, for example, a depletion mode thyristor (DMT) structure or a trench MOS barrier Schottky (TMBS) structure only when the apparatus has a Schottky interface formed on the wide band gap semiconductor, present therein.

INDUSTRIAL APPLICABILITY as described, the wide band gap semiconductor apparatus and the fabrication method therefor according to the present invention are useful for a power semiconductor apparatus used in an inverter for an industrial electric motor or a bullet train car that requires high current.

EXPLANATIONS OF LETTERS OR NUMERALS

1 silicon carbide substrate (wide band gap semiconductor substrate) of a first conductivity type
2 silicon carbide epitaxial layer (deposited semiconductor film) of the first conductivity type
3 impurity region of a second conductivity type
4 impurity region of the second conductivity type
5 impurity region of the second conductivity type
6 oxide film
7 back face electrode (ohmic electrode)
9 Schottky electrode (deposited metal film)
10 electrode pad
11 insulating layer
LB bottom width
LU top width

The invention claimed is:
1. A wide band gap semiconductor apparatus comprising:
a semiconductor substrate formed by a high concentration, wide band gap semiconductor of a first conductivity type;
a deposited semiconductor film formed on a surface of the semiconductor substrate and formed by a wide band gap semiconductor of the first conductivity type and having a concentration lower than that of the semiconductor substrate;
a deposited metal film formed on the deposited semiconductor film; and
a second conductivity type region formed in a vicinity of the deposited metal film in the deposited semiconductor film, wherein
a plurality of second conductivity type regions are disposed at predetermined intervals along a width direction in the deposited semiconductor film, at least at a position in a lower portion in a depth direction of the deposited metal film, and
the deposited semiconductor film has an internal width in the depth direction different from a width thereof at a position in an upper portion in the depth direction, wherein
an interval of the deposited semiconductor film is set to have a substantially rhombic shape with which the interval narrows from the position in the upper portion in the depth direction to the lower portion as a depth thereof becomes deeper and thereafter, widens.
2. The wide band gap semiconductor apparatus according to claim 1, wherein
the second conductivity type regions are disposed in stripes from a planar view thereof.

3. The wide band gap semiconductor apparatus according to claim 1, wherein
the second conductivity type region has an impurity concentration distribution in the depth direction according to which an impurity concentration is set to be in a range of ±90% up to an arbitrary depth and the impurity concentration is lowered with a depth in a portion deeper than the arbitrary depth.

4. The wide band gap semiconductor apparatus according to claim 1, wherein
an interval of the deposited semiconductor film between a pair of second conductivity type regions has a width of 1 µm or greater, at a shortest portion thereof.

5. The wide band gap semiconductor apparatus according to claim 1, wherein
an interval of the deposited semiconductor film between a pair of second conductivity type regions has a width of 4 µm or less, at a shortest portion thereof.

6. The wide band gap semiconductor apparatus according to claim 1, wherein
the deposited semiconductor film is silicon carbide.

7. The wide band gap semiconductor apparatus according to claim 1, wherein
the deposited semiconductor film is gallium nitride.

8. The wide band gap semiconductor apparatus according to claim 1, wherein
a height of a Schottky barrier formed in an interface between the deposited metal film and the deposited semiconductor film is 1.0 eV or greater.

9. The wide band gap semiconductor apparatus according to claim 1, wherein
a height of a Schottky barrier formed in an interface between the deposited metal film and the deposited semiconductor film is 0.5 eV or greater and lower than 1.0 eV.

10. A wide band gap semiconductor apparatus fabrication method of a wide band gap semiconductor apparatus having a semiconductor substrate formed by a high concentration, wide band gap semiconductor of a first conductivity type; a deposited semiconductor film formed on a surface of the semiconductor substrate and formed by a wide band gap semiconductor of the first conductivity type and having a concentration lower than that of the semiconductor substrate; a deposited metal film formed on the deposited semiconductor film; and a second conductivity type region formed in a vicinity of the deposited metal film in the deposited semiconductor film, the wide band gap semiconductor apparatus fabrication method comprising:
disposing a plurality of second conductivity type regions at predetermined intervals along a width direction in the deposited semiconductor film, and at least at a position in a lower portion in a depth direction of the deposited metal film; and
forming the deposited semiconductor film to have an internal width in the depth direction different from a width thereof at a position in an upper portion in the depth direction, wherein
the forming includes forming the deposited semiconductor film in a substantially rhombic shape such that the deposited semiconductor film narrows as its depth increases from a position in an upper portion in the depth direction to a lower portion thereof and thereafter, widens.

11. The wide band gap semiconductor apparatus fabrication method according to claim 10, wherein
the forming includes forming the deposited semiconductor film to have the internal width in the depth direction set to be wider than a width thereof at a position in an upper portion in the depth direction.

12. The wide band gap semiconductor apparatus fabrication method according to claim 10, wherein
the forming includes forming the deposited semiconductor film to have the internal width in the depth direction set to be narrower than a width thereof at a position in an upper portion in the depth direction.

* * * * *